(12) United States Patent
Kang et al.

(10) Patent No.: US 10,325,882 B2
(45) Date of Patent: Jun. 18, 2019

(54) METHOD OF MANUFACTURING SEMICONDUCTOR PACKAGE

(71) Applicant: Samsung Electronics Co., Ltd., Suwon-si (KR)

(72) Inventors: Tae-woo Kang, Suwon-si (KR); Byung-lyul Park, Seoul (KR); Kyoung-hwan Kim, Yongin-si (KR); Kun-sang Park, Hwaseong-si (KR); Young-gyu Ahn, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 15/651,933

(22) Filed: Jul. 17, 2017

(65) Prior Publication Data

US 2018/0108639 A1    Apr. 19, 2018

(30) Foreign Application Priority Data

Oct. 19, 2016   (KR) .................. 10-2016-0135925

(51) Int. Cl.
*H01L 23/02* (2006.01)
*H01L 25/065* (2006.01)
(Continued)

(52) U.S. Cl.
CPC .... *H01L 25/0657* (2013.01); *H01L 21/02063* (2013.01); *H01L 21/0274* (2013.01); *H01L 21/31111* (2013.01); *H01L 21/31144* (2013.01); *H01L 21/563* (2013.01); *H01L 21/76802* (2013.01); *H01L 21/76877* (2013.01); *H01L 23/13* (2013.01); *H01L 23/3135* (2013.01);
(Continued)

(58) Field of Classification Search
CPC ....... H01L 2224/97; H01L 2224/32225; H01L 2924/181; H01L 2924/15311; H01L 2924/15153
See application file for complete search history.

(56) References Cited

U.S. PATENT DOCUMENTS 5,731,243 A   3/1998   Peng et al.
5,938,856 A   8/1999   Sachdev et al.
(Continued)

FOREIGN PATENT DOCUMENTS

KR   10-1998-0015545   8/1996

*Primary Examiner* — Bradley Smith
*Assistant Examiner* — David J Goodwin
(74) *Attorney, Agent, or Firm* — Muir Patent Law, PLLC

(57) ABSTRACT

A method of manufacturing a semiconductor package includes providing a substrate including a mounting region having a recess space for accommodating a semiconductor chip and a connection region surrounding the mounting region, providing a semiconductor chip in the mounting region, the semiconductor chip including a connection pad provided on a top surface of the semiconductor chip, forming a protective layer covering a top surface of the substrate and the top surface of the semiconductor chip, forming a photosensitive insulating layer on the protective layer after forming the protective layer, patterning the photosensitive insulating layer thereby exposing the protective layer, removing the exposed protective layer, and forming a redistribution line to be electrically connected to the connection pad.

19 Claims, 8 Drawing Sheets

(51) Int. Cl.
  *H01L 21/02* (2006.01)
  *H01L 21/027* (2006.01)
  *H01L 21/311* (2006.01)
  *H01L 21/56* (2006.01)
  *H01L 21/768* (2006.01)
  *H01L 23/13* (2006.01)
  *H01L 23/31* (2006.01)
  *H01L 23/00* (2006.01)
  *H01L 25/00* (2006.01)
  *H01L 23/498* (2006.01)

(52) U.S. Cl.
  CPC ........ *H01L 23/3142* (2013.01); *H01L 23/498* (2013.01); *H01L 24/05* (2013.01); *H01L 24/11* (2013.01); *H01L 24/19* (2013.01); *H01L 24/20* (2013.01); *H01L 24/24* (2013.01); *H01L 24/82* (2013.01); *H01L 25/50* (2013.01); *H01L 24/13* (2013.01); *H01L 24/16* (2013.01); *H01L 2224/0231* (2013.01); *H01L 2224/08145* (2013.01); *H01L 2224/12105* (2013.01); *H01L 2224/13024* (2013.01); *H01L 2224/16145* (2013.01); *H01L 2225/06541* (2013.01); *H01L 2225/06548* (2013.01); *H01L 2225/06565* (2013.01); *H01L 2225/06586* (2013.01); *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 6,172,423 B1 * | 1/2001 | Lee | H01L 23/13 |
| | | | 257/685 |
| 6,759,319 B2 | 7/2004 | Viswanadam et al. | |
| 6,800,141 B2 | 10/2004 | Sachdev et al. | |
| 7,358,177 B2 | 4/2008 | Ke et al. | |
| 7,968,445 B2 | 6/2011 | Lin et al. | |
| 8,642,390 B2 | 2/2014 | Wang et al. | |
| 2002/0123221 A1 * | 9/2002 | Jost | C23C 16/401 |
| | | | 438/680 |
| 2004/0155325 A1 * | 8/2004 | Ma | H01L 23/3128 |
| | | | 257/678 |
| 2005/0068672 A1 * | 3/2005 | Lee | G11B 5/3163 |
| | | | 29/603.01 |
| 2008/0054443 A1 * | 3/2008 | Shih | H01L 23/5389 |
| | | | 257/698 |
| 2008/0284009 A1 | 11/2008 | Min | |
| 2009/0302435 A1 * | 12/2009 | Pagaila | H01L 21/561 |
| | | | 257/659 |
| 2012/0020026 A1 * | 1/2012 | Oganesian | H01L 23/5389 |
| | | | 361/707 |
| 2013/0026658 A1 | 1/2013 | Chen | |

* cited by examiner

METHOD OF MANUFACTURING SEMICONDUCTOR PACKAGE

CROSS-REFERENCE TO RELATED APPLICATION

This application claims the benefit of priority under 35 U.S.C. § 119(a) to Korean Patent Application No. 10-2016-0135925, filed on Oct. 19, 2016, in the Korean Intellectual Property Office, the disclosure of which is incorporated herein in its entirety by reference.

BACKGROUND

The present disclosure relates to a method of manufacturing a semiconductor package, and more particularly, to a method of manufacturing a semiconductor package, which includes a process of forming a redistribution line.

According to recent technological development in the field of electronic devices in line with users' demands, electronic devices are getting smaller and lighter, and semiconductor packages used in the electronic devices are required to have high performance, and high capacity, while having smaller size and lighter volume. To meet these demands, research and development into fan-out panel level packages (FO-PLPs) and methods of manufacturing the FO-PLPs have been increasing.

SUMMARY

The present disclosure provides a method of manufacturing a semiconductor package, whereby the semiconductor package may be formed to have high performance, high capacity, miniaturized size, and light weight.

According to an aspect of the present disclosure, there is provided a method of manufacturing a semiconductor package, the method including: providing a substrate including a mounting region having a recess space for accommodating a semiconductor chip and a connection region surrounding the mounting region; providing a semiconductor chip in the mounting region, the semiconductor chip including a connection pad formed on a top surface of the semiconductor chip; forming a protective layer covering a top surface of the substrate and the top surface of the semiconductor chip; forming a photosensitive insulating layer on the protective layer after forming the protective layer; patterning the photosensitive insulating layer thereby exposing the protective layer; removing the exposed protective layer; and forming a redistribution line to be electrically connected to the connection pad.

According to another aspect of the present disclosure, there is provided a method of manufacturing a semiconductor package, the method including: providing a substrate having a cavity region for accommodating a semiconductor chip and a ball-land region around the cavity region; mounting a first semiconductor chip in the cavity region; stacking a second semiconductor chip on the first semiconductor chip in the cavity region, the second semiconductor chip including a connection pad formed on a top surface of the second semiconductor chip; forming a protective layer covering a top surface of the substrate and the top surface of the second semiconductor chip; forming a photosensitive insulating layer on the protective layer; patterning the photosensitive insulating layer to expose the protective layer; forming a via hole by removing a residue of the photosensitive insulating layer while removing the exposed protective layer; filling the via hole to form a redistribution line for electrically connecting the connection pad to the ball-land region; and forming an external connection terminal electrically connected to the ball-land region.

According to another aspect of the present disclosure, there is provided a method of manufacturing a semiconductor package, the method including: providing a substrate including a recess space for accommodating a semiconductor chip and a connection region surrounding the recess space; providing a semiconductor chip in the recess space, the semiconductor chip including a connection pad formed on a top surface of the semiconductor chip; forming a protective layer covering a top surface of the substrate and the top surface of the semiconductor chip including the connection pad; coating a photosensitive insulating film on the protective layer after forming the protective layer; irradiating light to the photosensitive insulating layer to form a trench so that the protective layer on the connection pad is exposed; removing the exposed protective layer; and forming a redistribution line to be electrically connected to the connection pad.

BRIEF DESCRIPTION OF THE DRAWINGS

Embodiments of the present disclosure will be more clearly understood from the following detailed description taken in conjunction with the accompanying drawings in which.

DETAILED DESCRIPTION

Figure 1:
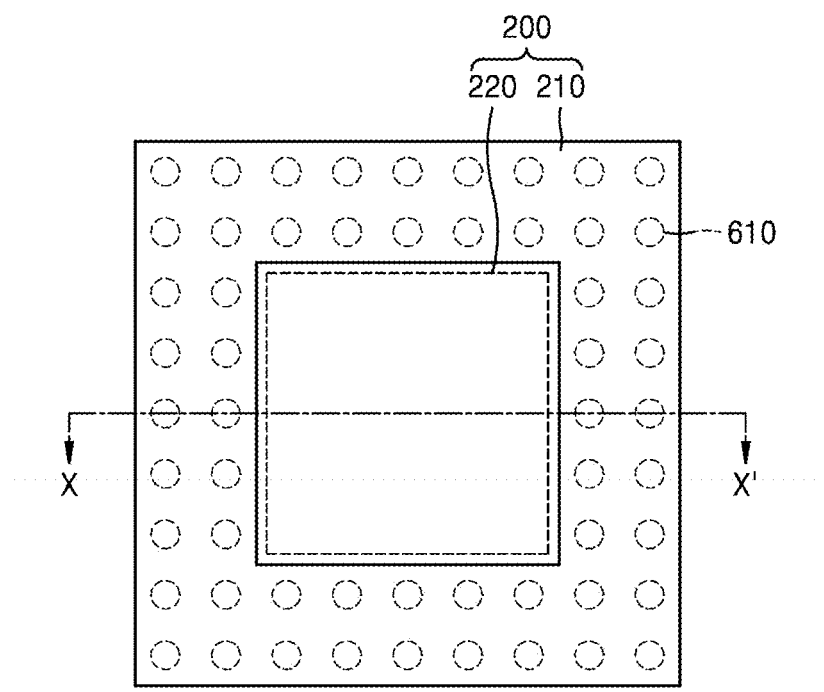
FIGS. 1 to 10 are cross-sectional views for explaining a method of manufacturing a semiconductor package, according to an exemplary embodiment of the present disclosure, illustrated according to process order.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g.

"first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

FIGS. 1 to 10 are cross-sectional views for explaining a method of manufacturing a semiconductor package, according to an exemplary embodiment of the present disclosure, illustrated according to process order. FIGS. 2 to 10 are cross-sectional views taken along a line X-X' of FIG. 1.

Referring to FIG. 1, a substrate 200 forming a semiconductor package 10 (see FIG. 10) may include a mounting region 220 on which a semiconductor chip 100 (see FIG. 2) may be mounted, and a connection region 210 surrounding the mounting region 220.

The substrate 200 may be, for example, a printed circuit board (PCB), a ceramic substrate, a wafer for fabricating a package, or an interposer.

The mounting region 220 may be formed as an opening or a cavity. For the example, the mounting region 220 may be formed to have an opening or a recess space in which the semiconductor chip 100 may be mounted (see FIG. 2). The mounting region 220 may be formed in a portion of the substrate 200, for example, a central region, but the disclosure is not limited thereto. For example, in some embodiments, the mounting region 220 may be formed in a portion of the substrate 200 other than the central region. The mounting region 220 may be recessed from the top surface of the substrate 200 to a predetermined depth or may be formed to be open. Dry etching, wet etching, screen printing, drill bit, laser drilling, or the like may be used to recess or open the substrate 200. For example, the recess space of the mounting region of the substrate 200 may include an opening or a cavity in which the semiconductor chip 100 (see FIG. 2) may be accommodated. For example, in some embodiments, the semiconductor chip 100 may be placed in the mounting region 220 which includes the opening or the cavity, and after placing the semiconductor chip 100 in the mounting region 220, an encapsulant may be filled in a space between the mounting region 220 and the semiconductor chip 100 to mount the semiconductor chip 100 on the substrate 200. In some embodiments, the semiconductor chip 100 may be placed in the mounting region 220 which includes the opening or the cavity, and after placing the semiconductor chip 100 in the mounting region 220, an adhesive may be provided on the bottom surface of the semiconductor chip 100 to mount the semiconductor chip 100 on the substrate 200.

The connection region 210 may include a top surface and a bottom surface and a single layer or multilayer interconnection pattern for electrically connecting the top surface and the bottom surface of the connection region 210. A conductive pad may be formed on the top surface and/or the bottom surface of the connection region 210. For example, an external connection terminal 610 electrically connected to the conductive pad on the top surface of the connection region 210 may be formed. The connection region 210 may be formed according to a ball layout defined in the international standard, regardless of the size of the mounting region 220.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

As used herein, the semiconductor package 10 may refer to a semiconductor device having one or more chips stacked on a package substrate. The semiconductor package 10 may also refer to a plurality of stacked packages, such as a package-on-package device. The term "semiconductor device" may be used generally to refer to one of these packages, whether a single package or a package-on-package device, and may also be used to refer to devices such as single semiconductor chips, e.g., formed on a die from a wafer.

For example, according to an embodiment of the present disclosure, even if the size of the semiconductor chip 100 is reduced according to the development of semiconductor manufacturing technology, the reliability of the semiconductor package 10 may be secured by maintaining a constant ball layout of the connection region 210 for the semiconductor chip 100 to be packaged without being influenced by the chip size.

Figure 2:
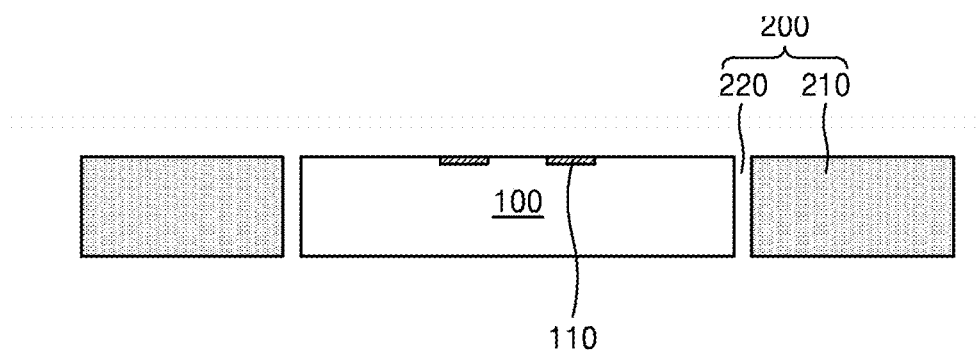

Referring to FIG. 2, the semiconductor chip 100 may be inserted into the mounting region 220 so that the top surface of the semiconductor chip 100, on which a connection pad 110 is formed, faces upward, and thus, the top surface of the semiconductor chip 100 may be aligned with the top surface of the substrate 200.

The semiconductor chip 100 may be a logic chip or a memory chip. The logic chip may be, for example, a microprocessor, an analog device, or a digital signal processor. The memory chip may be a volatile memory chip such as dynamic random access memory (DRAM) or static random access memory (SRAM), or may be a non-volatile memory chip such as phase-change random access memory (PRAM), magnetoresistive random access memory (MRAM), ferroelectric random access memory (FeRAM), or resistive random access memory (RRAM). In some embodiments, the semiconductor chip 100 may be a high bandwidth memory (HBM) DRAM.

The size of the mounting region 220 may be greater than the size of the semiconductor chip 100. In some embodiments, a certain gap is included between the semiconductor chip 100 and the mounting region 220 of the substrate 200 so that an encapsulant 230 (see FIG. 3) may be inserted. The gap may be formed to the extent that the encapsulant 230 may be inserted.

The top surface of the semiconductor chip 100 may be aligned with the top surface of the substrate 200. In some embodiments, the top surface of the semiconductor chip 100 may be aligned with the top surface of the substrate 200 so as to be coplanar with the top surface of the substrate 200. Alternatively, the level of the top surface of the semiconductor chip 100 may be lower than the level of the top surface of the substrate 200.

In some embodiments, the bottom surface of the semiconductor chip 100 may be aligned with the bottom surface of the substrate 200 so as to be coplanar with the bottom surface of the substrate 200, depending on the thickness of the semiconductor chip 100 and the thickness of the substrate 200. Alternatively, the level of the bottom surface of the semiconductor chip 100 may be higher than the level of the bottom surface of the substrate 200.

Figure 3:
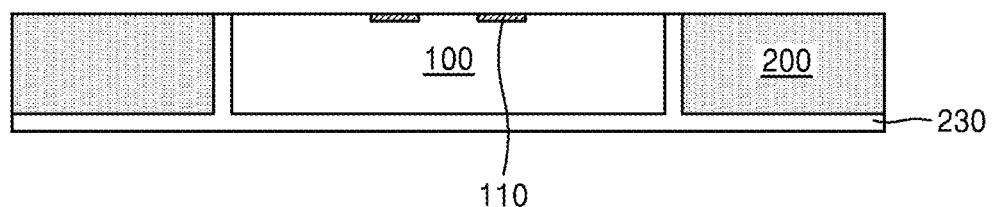

Referring to FIG. 3, the encapsulant 230 is formed to fill a space between the semiconductor chip 100 and the substrate 200 and cover the bottom surface of the semiconductor chip 100 and the bottom surface of the substrate 200.

In a process of filling the space with the encapsulant 230, silicon oxide (not shown) is first deposited to a predetermined thickness. The top surface of the semiconductor chip 100 and the top surface of the substrate 200 may be connected to each other by the silicon oxide by filling a gap between the semiconductor chip 100 and the substrate 200. A portion of the space between the semiconductor chip 100 and the substrate 200, which is not filled with the silicon oxide, may be filled with a polymer such as polyimide.

The encapsulant 230 may be integrated with the semiconductor chip 100 and the substrate 200 by a molding process. The encapsulant 230 may be filled in the gap between the semiconductor chip 100 and the substrate 200. The semiconductor chip 100 and the substrate 200 may be firmly fixed as the encapsulant 230 is filled in the gap.

In some embodiments, the encapsulant 230 may completely cover the sides and bottom surface of the semiconductor chip 100 to seal the semiconductor chip 100. Such a process of sealing the semiconductor chip 100 is referred to as an encapsulation process. For example, the bottom surface of the semiconductor chip 100 may not be exposed to the outside by the encapsulation process.

In some embodiments, the encapsulant 230 may be filled so that the bottom surface of the semiconductor chip 100 is exposed to the outside. For example, the encapsulant 230 may be filled at the same level as the bottom surface of the semiconductor chip 100 to minimize the height of the semiconductor package 10 (see FIG. 10). Alternatively, after the sides and bottom surface of the semiconductor chip 100 are completely covered with the encapsulant 230, the encapsulant 230 may be polished so that the bottom surface of the semiconductor chip 100 and the bottom surface of the substrate 200 are exposed to the outside.

Figure 4:
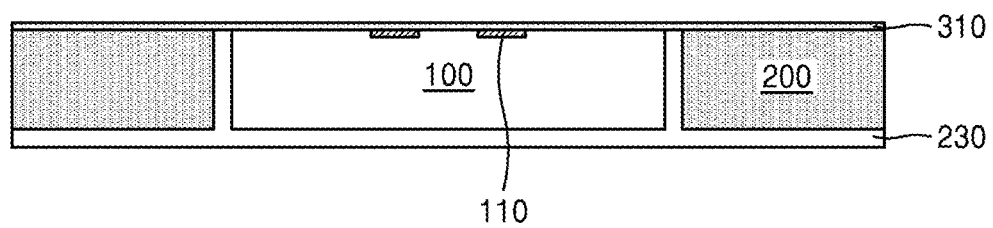

Referring to FIG. 4, a protective layer 310 is formed to cove the top surface of the semiconductor chip 100 and the top surface of the substrate 200.

The protective layer 310 may include an insulating material, and may be, for example, a silicon oxide layer, a silicon nitride layer, or a silicon oxynitride layer. The protective layer 310 may include a material having excellent bonding properties with respect to the semiconductor chip 100.

The silicon-based insulating layer, for example, the silicon oxide layer, the silicon nitride layer, or the silicon oxynitride layer, has excellent insulation performance and is formed to reflect the shape of a lower layer. The protective layer 310 may be formed depending on the shape of the top surface of the semiconductor chip 100 and the shape of the top surface of the substrate 200. The profile of the protective layer 310 may be substantially the same as or similar to the profile of the top surface of the semiconductor chip 100 and the profile of the top surface of the substrate 200. Accordingly, the protective layer 310 may be formed to evenly cover the top surface of the semiconductor chip 100 and the top surface of the substrate 200. However, the shape of the protective layer 310 may vary depending on materials to be used, process conditions, and subsequent processes.

The connection pad 110 may be electrically connected to a circuit portion of the semiconductor chip 100 to electrically connect the semiconductor chip 100 to an external device. The connection pad 110 is a part for inputting/outputting an electrical signal to/from the semiconductor chip 100, and a plurality of connection pads 110 may be provided on the semiconductor chip 100. The connection pad 110 may include a metal having comparatively low resistivity, such as aluminium (Al) or copper (Cu). Accordingly, the protective layer 310 may prevent the connection pad 110 from being exposed to the air, thereby preventing the connection pad 110 from being oxidized.

Figure 10:
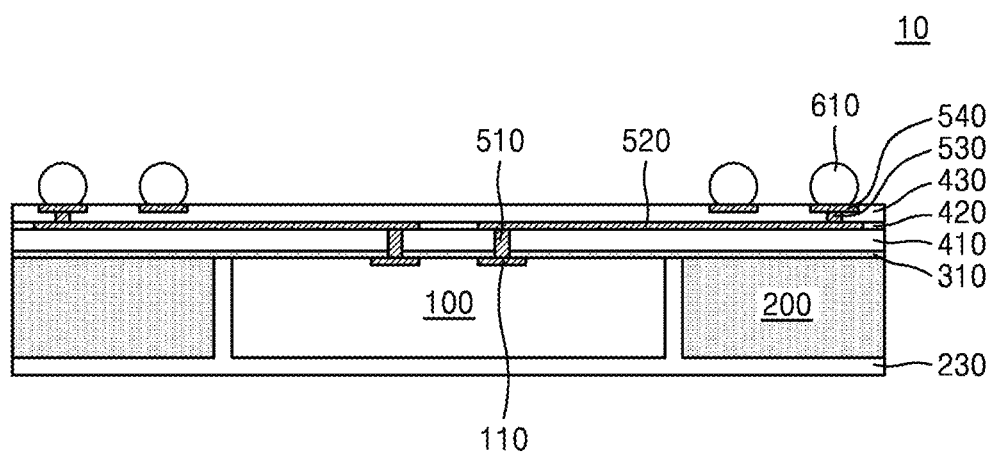

According to an exemplary embodiment of the present disclosure, the protective layer 310 may prevent a residue of a photosensitive insulating layer 410 (see FIG. 5) from remaining on the connection pad 110 of the semiconductor chip 100, thereby improving electrical characteristics of the semiconductor package 10 (see FIG. 10). Details will be described later.

Figure 5:
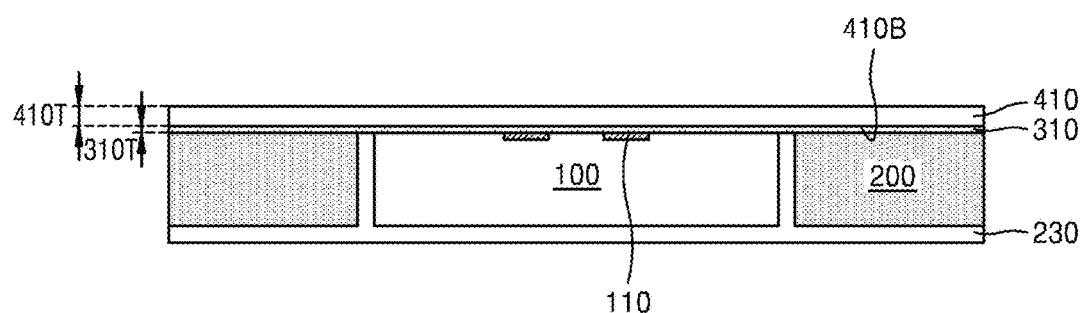

Referring to FIG. 5, the photosensitive insulating layer 410 is formed on the protective layer 310 to a predetermined thickness.

The photosensitive insulating layer 410 may include a polymeric resin material, for example, photo-imageable dielectric (PID). The PID may remain as an insulating layer, which is a component of the semiconductor package 10 (see FIG. 10), after an exposure process and an etching process to be described later.

The photosensitive insulating layer 410 may be a positive type. The positive type is a type in which a region irradiated with light reacts. The photosensitive insulating layer 410 may be in the form of a film, but the present disclosure is not limited thereto. When the photosensitive insulating layer 410 is in the form of a film, a roll laminator may be used to form the photosensitive insulating layer 410 on the protective layer 310. For example, the photosensitive insulating layer 410 in the form of a film may be coated on the protective layer 310.

The bottom surface 410B of the photosensitive insulating layer 410 may be coated with an adhesive to improve the adhesion to the protective layer 310. The adhesive may be an inorganic adhesive or a polymer adhesive. The polymer adhesive may be a thermosetting resin or a thermoplastic resin, or may be of a hybrid type formed by mixing the two components, i.e., a thermosetting resin and a thermoplastic resin.

A thickness 410T of the photosensitive insulating layer 410 in a first direction may be greater than a thickness 310T of the protective layer 310 in the first direction. The thickness 310T of the protective layer 310 may be minimized to protect the top surface of the connection pad 110. The thickness 410T of the photosensitive insulating layer 410 may be a thickness sufficient to form a trench 410H (see FIG. 6).

Figure 6:
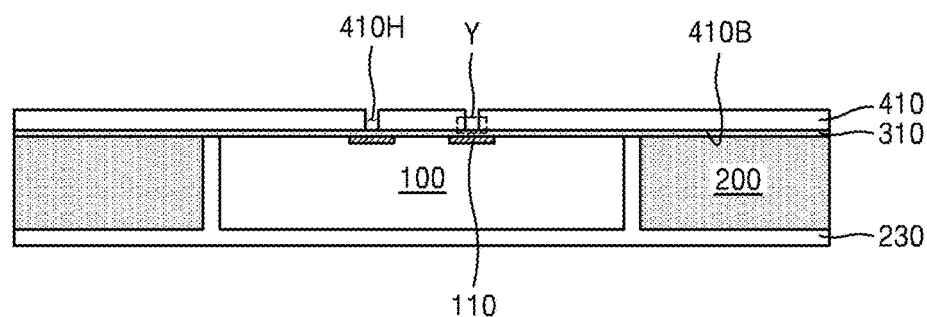

Referring to FIG. 6, the photosensitive insulating layer 410 is irradiated with light or laser to form the trench 410H.

A process of exposing the photosensitive insulating layer 410 to light or laser may include a stage of etching the photosensitive insulating layer 410 and a stage of dissolving the photosensitive insulating layer 410. Both stages may be performed at the same time.

When the photosensitive insulating layer 410 is irradiated with light or laser, an upper portion of the photosensitive insulating layer 410 is etched and a lower portion of the photosensitive insulating layer 410 is dissolved. Specifically, since a depth at which light or laser may etch the photosensitive insulating layer 410 is limited, the photosensitive insulating layer 410 may be etched to a predetermined depth, and a non-etched lower portion of the photosensitive insulating layer 410 is exposed to the light or laser and thus is dissolved. Since the stage of etching the photosensitive insulating layer 410 and the stage of dissolving the photosensitive insulating layer 410 are performed at the same time (e.g., simultaneously), the photosensitive insulating layer 410 may be continuously etched and dissolved by the same light or laser. For example, when the photosensitive insulating layer 410 is exposed to light or laser, both etching and dissolution processes are performed.

As a result, by irradiating light or laser to the photosensitive insulating layer 410, the trench 410H is formed so that the protective layer 310 on the connection pad 110 is exposed. Using the photosensitive insulating layer 410, a desired pattern may be obtained without using a photomask such as a photoresist.

Figure 7A:
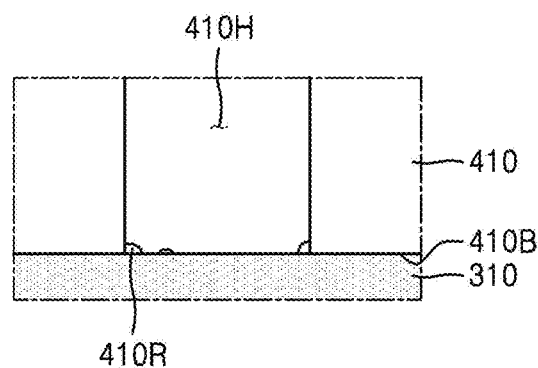
Figure 7B:
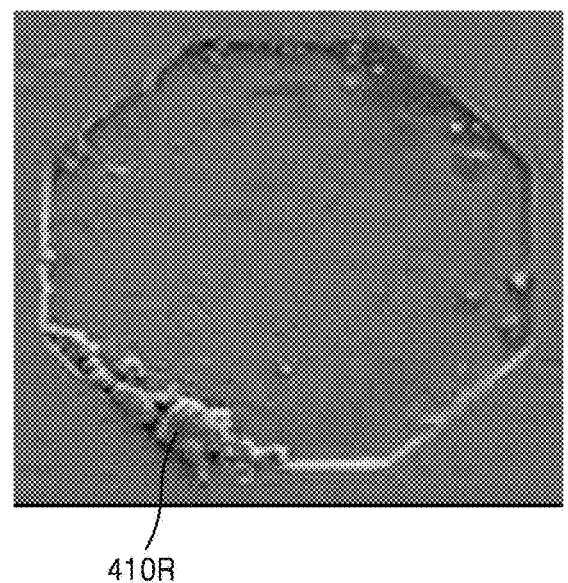

FIG. 7A schematically shows a state in which a residue 410R of the photosensitive insulating layer 410 remains on the top surface of the protective layer 310 after the trench 410H is formed. FIG. 7B is a scanning electron microscope (SEM) photograph showing a state in which the residue 410R of the photosensitive insulating layer 410 remains on the connection pad 110 (see FIG. 6) when the protective layer 310 is not formed.

In recent semiconductor devices, as a semiconductor chip size is reduced due to miniaturization of process technology and the number of input/output terminals increases due to diversification of functions, pitches of connection pads are getting smaller and smaller. In addition, as the convergence of various functions accelerates, a technology for integrating various devices into one semiconductor package is emerging.

A semiconductor package may be manufactured by a flip chip process using a bumping technique for electrical connection between semiconductor chips or between a semiconductor chip and a substrate. In such a bumping technique, the number of input/output terminals of the semiconductor package and the size of the semiconductor chip may be limited due to the limitation of bump miniaturization.

For example, when the size of the semiconductor chip is reduced or the number of input/output terminals increases, there is a limitation in accommodating a large number of solder balls, which are final input/output terminals, on the top surface of the semiconductor chip. To overcome this shortcoming, the semiconductor package may have an embedded structure for mounting a semiconductor chip inside a substrate or a fan-out structure for arranging solder balls, which are final input/output terminals of the semiconductor chip, on the outer circumferential surface of the semiconductor chip. In particular, a fan-out panel level package (FO-PLP), in which a substrate is arranged on the outer circumferential surface of a semiconductor chip to form a redistribution line, and a method of manufacturing the FO-PLP have been continuously studied and developed.

In a process of manufacturing the FO-PLP, a photosensitive insulating layer such as PID may be used as an insulating layer for forming the redistribution line. As described above, the photosensitive insulating layer 410 may be in the form of a film and include an adhesive on the bottom surface 410B. However, it is difficult to completely remove the adhesive due to the characteristics of the constituent material thereof. Accordingly, if the adhesive remains as a residue on the top surface of a connection pad, a contact resistance of the redistribution line may increase, and the electrical characteristics of the semiconductor package may deteriorate.

It is very difficult to completely remove the residue 410R of the photosensitive insulating layer 410 even by using a general residue removing process, for example, an ashing process, a plasma etching process, a wet etching process, or a cleaning process.

Thus, according to an embodiment of the present disclosure, the residue 410R of the photosensitive insulating layer 410 remains on the top surface of the protective layer 310, not on the top surface of the connection pad 110, so that the residue 410R and the protective layer 310 are sequentially or simultaneously removed during a process of etching the protective layer 310. Details of this process will be described later.

Figure 8:
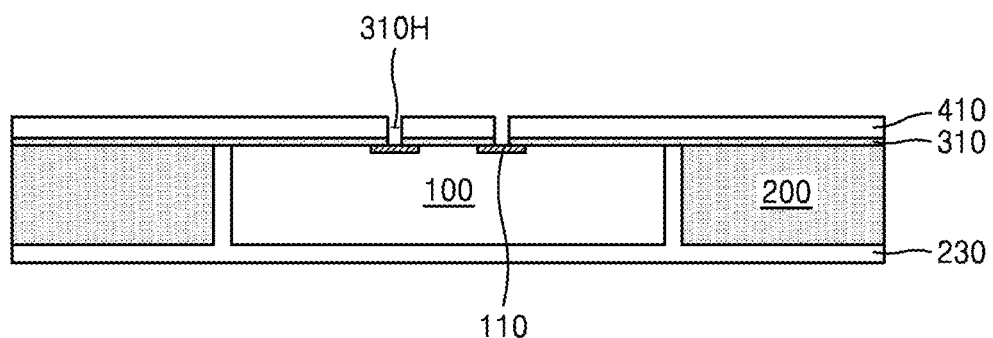

Referring to FIG. 8, the residue 410R (see FIG. 7) of the photosensitive insulating layer 410 remaining on the exposed protective layer 310 and the exposed protective layer 310 are removed.

In some embodiments, a process of removing the residue 410R of the photosensitive insulating layer 410 and the exposed protective layer 310 may be a process of removing the residue 410R of the photosensitive insulating layer 410 at the same time as removing the exposed protective layer 310.

In order to expose the connection pad 110, the protective layer 310, which includes an insulating material existing on the connection pad 110, has to be removed. As described above, the residue 410R of the photosensitive insulating layer 410 may be on the top surface of the exposed protective layer 310. The protective layer 310 may be removed by wet etching or dry etching. During a process of etching the protective layer 310, the residue 410R of the photosensitive insulating layer 410 may be simultaneously removed.

In some embodiments, a process of removing the residue 410R of the photosensitive insulating layer 410 and the exposed protective layer 310 may include descumming the residue 410R from the photosensitive insulating layer 410 and etching the exposed protective layer 310, which are sequentially performed.

First, a descum process is a process of removing the residue 410R from the photosensitive insulating layer 410 by using an oxygen plasma etching process or the like. However, the residue 410R of the photosensitive insulating layer 410 may not be completely removed even if after the descum process is performed. In addition, if the protective layer 310 does not exist and the connection pad 110 is exposed immediately, the connection pad 110 may be damaged by the oxygen plasma etching process.

According to an embodiment of the present disclosure, such problems are addressed. For example, even if the residue 410R of the photosensitive insulating layer 410 is not completely removed by the descum process, the residue 410R may be removed during the process of etching the protective layer 310, and the connection pad 110 may not damaged by the descum process.

After the descum process, the residue 410R of the photosensitive insulating layer 410 may be removed in the process of etching the exposed protective layer 310. The protective layer 310 may be removed by wet etching or dry etching.

A via hole 310H through which the connection pad 110 is exposed may be formed by removing the residue 410R of the photosensitive insulating layer 410 and the exposed protective layer 310. Then, a process of curing the photosensitive insulating layer 410 may be performed. The curing process is a process of hardening the photosensitive insulating layer 410 to maintain the shape of the photosensitive insulating layer 410 in which the via hole 310H is formed. After the exposure process and the etching process, since the photosensitive insulating layer 410 may be difficult to maintain the shape thereof, the patterned shape of the via hole 310H may be maintained by going through the curing process. The curing process may be performed at a specific temperature for a specific time.

Figure 9:
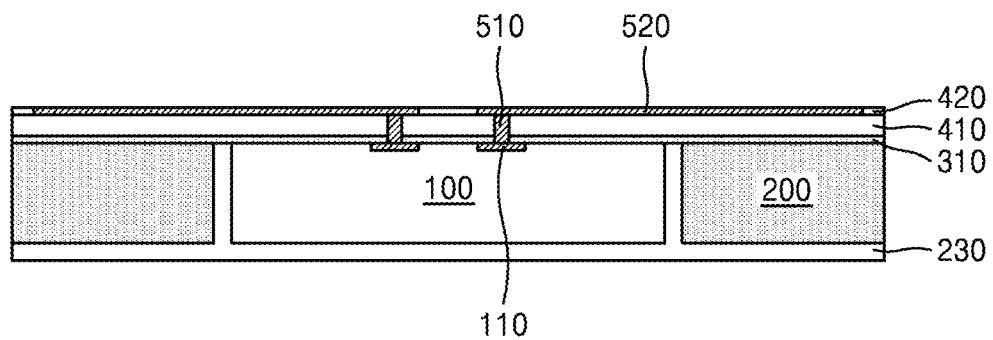

Referring to FIG. 9, a via 510 and a redistribution line 520 are formed in the photosensitive insulating layer 410.

In one embodiment, first, a seed layer (not shown) is formed on the photosensitive insulating layer 410 so that the inner surface of the via hole 310H (see FIG. 8) is covered. In this case, both the top surface of the photosensitive insulating layer 410 and the inner surface of the via hole 310H may be covered with the seed layer. The seed layer may be formed by an electroless plating process (also referred to as a chemical or auto-catalytic plating which is a non-galvanic plating method that involves several simultaneous reactions in an aqueous solution, which occur without the use of external electrical power) or a sputtering process. Particularly, a process of forming the seed layer may be used in forming the via 510 in the via hole 310H by using a plating process, and may be omitted according to a method of the formation of the via 510 in the via hole 310H.

The process of forming the via 510 in the via hole 310H includes filling the inside of the via holes 310H with metal. The via 510 may include copper (Cu), nickel (Ni), gold (Au), chrome (Cr), titanium (Ti), palladium (Pd), or an alloy thereof. The via 510 may be formed by a plating method, in which case a metal may be plated on the seed layer. In this case, the via 510 may be formed by electroplating. The via 510 and the seed layer may include the same metal, for example, copper (Cu).

The redistribution line 520 may be formed on the top surface of the via 510 and the top surface of the photosensitive insulation layer 410. The redistribution line 520 may include the same metal as the via 510. The redistribution line 520 may be formed by electroplating. For example, a redistribution layer may be plated on the seed layer. The redistribution line 520 is formed by patterning the redistribution layer by using an exposure process and an etching process. An insulating layer pattern 420 may be formed between patterned redistribution lines 520. The insulating layer pattern 420 may include a silicon oxide layer, a silicon nitride layer, a silicon oxynitride layer, or a PID.

In some embodiments, the via 510 and the redistribution lines 520 may be simultaneously formed through a damascene process. For example, after a conductive layer filling the inside of the via hole 310H and covering the top surface of the photosensitive insulating layer 410 is formed, the via 510 and the redistribution line 520 may be simultaneously formed by using an etching process such as etch-back.

Referring to FIG. 10, a redistribution via 530 and a redistribution pad 540 are formed on the redistribution line 520 and an external connection terminal 610 is formed on the redistribution pad 540 to complete the semiconductor package 10.

A method of forming the redistribution via 530 and the redistribution pad 540 is similar to the process of forming the via 510 and the redistribution line 520, described above. A second photosensitive insulating layer 430 is formed on the redistribution line 520 and light or laser is irradiated to the second photosensitive insulating layer 430 to form a trench and expose the redistribution line 520. Subsequently, the redistribution via 530 and a redistribution pad layer are formed by performing an electroplating process for filling the trench, and the redistribution pad layer is patterned to form the redistribution pad 540.

The external connection terminal 610 may be electrically connected to the redistribution pad 540. For example, the external connection terminal 610 may be electrically connected to the connection pad 110. Through the external connection terminal 610, at least one of a control signal, a power supply signal, and a ground signal for the operation of the semiconductor chip 100 may be received from the outside (e.g., outside of the semiconductor package 10), a data signal to be stored in the semiconductor chip 100 may be received from the outside, or a data signal stored in the semiconductor chip 100 may be provided to the outside. For example, the external connection terminal 610 may have a pillar structure and include a solder ball or a solder layer.

When the external connection terminal 610 is in the form of a solder ball, the external connection terminal 610 may be formed into a ball shape by a surface tension effect after a reflow process. In some embodiments, a lead-free solder ball including tin (Sn) may be used as the external connection terminal 610.

The surface of the redistribution pad 540 may be subjected to surface treatment such as organic coating or metal plating to prevent the surface from being oxidized. For example, the organic coating may be an organic solder preservation (OSP) coating and the metal plating may be treated with gold (Au), nickel (Ni), lead (Pb), or silver (Ag).

The external connection terminal 610 may be arranged above the substrate 200 by forming the redistribution line 520. A position at which the external connection terminal 610 is formed may be different from the position of the connection pad 110 of the semiconductor chip 100 due to the redistribution line 520. For example, regardless of the size of the semiconductor chip 100, the semiconductor package 10 may be manufactured according to a ball layout defined in the international standard. It should be noted that although certain explanations herein describe features with respect to only one element (e.g., an external connection terminal 610), it should be evident from the drawings that a plurality of such elements are included in the various embodiments shown in the various figures.

Consequently, in the semiconductor package 10 manufactured by the manufacturing method according to one embodiment of the present disclosure, the protective layer 310 for protecting the connection pad 110 of the semiconductor chip 100 is formed before the photosensitive insulating layer 410 is formed on the connection pad 110. Thus, the residue 410R (see FIG. 7) of the photosensitive insulating layer 410 does not remain on the connection pad 110, and thus, a contact resistance between the connection pad 110 and the via 510 may decrease, thereby improving the electrical characteristics of the semiconductor package 10.

FIGS. 11 to 14 are cross-sectional views of semiconductor packages manufactured by a semiconductor package manufacturing method according to exemplary embodiments of the present disclosure.

Figure 11:
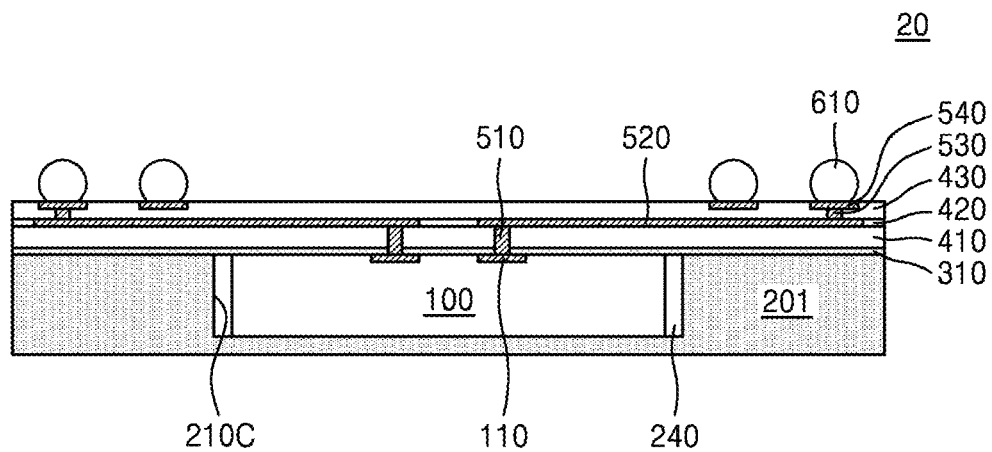
FIGS. 11 to 14 are cross-sectional views of semiconductor packages manufactured by a method of manufacturing a semiconductor package, according to exemplary embodiments of the present disclosure.

Referring to FIG. 11, a semiconductor package 20, in which a semiconductor chip 100 is mounted in a substrate 201 including a cavity region 210C, is illustrated.

The semiconductor chip 100 in the semiconductor package 20 is mounted so as to be completely accommodated in the cavity region 210C of the substrate 201, and an adhesive member (not shown) may be formed on the bottom surface of the semiconductor chip 100 to fix the semiconductor chip 100 to the substrate 201.

In order to facilitate the mounting of the semiconductor chip 100, the semiconductor chip 100 has a size slightly smaller than the size of the cavity region 210C. The top surface of the substrate 201 and the top surface of the semiconductor chip 100 may be aligned on the same plane, and a space between the side surface of the semiconductor chip 100 and the side surface of the cavity region 210C is filled with an encapsulant 240.

A process of manufacturing the semiconductor package 20 is the same as or similar to the process of manufacturing the semiconductor package 10, described above with reference to FIGS. 1 to 10, except for a mounting region of the semiconductor chip 100, and thus, detailed description thereof will be omitted.

Figure 12:
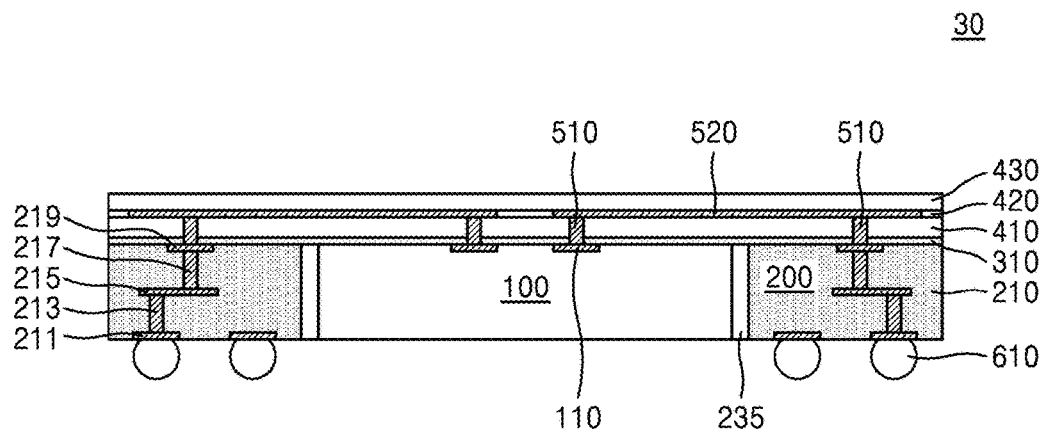

Referring to FIG. 12, a semiconductor package 30, in which an external connection terminal 610 is formed on the bottom surface of a substrate 200, is illustrated.

In the semiconductor package 30, a semiconductor chip 100 is mounted in a substrate 200 having a mounting region and a connection region 210 around the mounting region, in which a ball-land is formed, and a redistribution line 520 may be formed to form the external connection terminal 610 on a surface opposite to a surface on which a connection pad 110 is formed.

The connection region 210 in which the ball-land is formed is a region in which an upper conductive pad 219, at which a via 510 is positioned, is positioned on an upper via 217 and overlaps the upper via 217 and a lower conductive pad 211, at which the external connection terminal 610 is positioned, is positioned under a lower via 213 and overlaps the lower via 213.

In more detail, the connection region 210 has a structure in which the upper conductive pad 219, an intermediate metal layer 215, and the lower conductive pad 211 are sequentially stacked on an insulating member. The upper conductive pad 219, the intermediate metal layer 215 and the lower conductive pad 211 are electrically connected to each other by the upper via 217 and the lower via 213. In addition, the upper conductive pad 219 and the lower conductive pad 211 are each surrounded by an insulating member while exposing only connection portions. An exposed region of the lower conductive pad 211 is a region to which the external connection terminal 610 such as a solder ball is attached after surface treatment is performed, and an exposed region of the upper conductive pad 219 corresponds to a ball-land to which the via 510 is electrically connected after surface treatment is performed.

The size of the via 510 may be smaller than the size of the external connection terminal 610. Accordingly, the exposed region of the upper conductive pad 219 may be smaller than the exposed region of the lower conductive pad 211. The upper conductive pad 219 and the lower conductive pad 211 may perform the same function even if the size of the exposed region of the upper conductive pad 219 and the size of the exposed region of the lower conductive pad 211 are different from each other.

Although the substrate 200 in which a multilayer interconnection pattern having three layers exists is illustrated in FIG. 12 by way of example, the multilayer interconnection pattern may have one, two, or four or more layers as required.

The substrate 200 may be a printed circuit board (PCB) having a single-layer or multilayer interconnection pattern therein. When the substrate 200 is the PCB, the PCB 200 may include a body layer, a lower protective layer, and an upper protective layer as a supporting substrate of the semiconductor chip 100. A single-layer or multilayer interconnection pattern is formed in the PCB 200, and the upper conductive pad 219 in the PCB 200 may be electrically connected to the connection pad 110 of the semiconductor chip 100 through the via 510 and the redistribution line 520. The external connection terminal 610 may be arranged on the bottom surface of the PCB 200. The PCB 200 may be mounted while being electrically connected to a module substrate or a system board through the external connection terminal 610.

A single-layer or multilayer interconnection pattern may be formed in the body layer, and the external connection terminal 610 may be electrically connected to the semiconductor chip 100 through the interconnection pattern. The lower protective layer and the upper protective layer serve to protect the body layer, and may include, for example, a solder resist (not shown).

The body layer may be realized by compressing a polymer material such as a thermosetting resin, an epoxy resin such as flame retardant 4 (FR-4), bismaleimide triazine (BT) or ajinomoto build up film (ABF), or a phenol resin to a predetermined thickness so as to form a thin layer, forming a copper foil on both sides of the thin layer, and then forming a conductive pattern as a transmission path of an electrical signal through patterning. Also, conductive patterns formed on the bottom and top surfaces of the body layer may be electrically connected to each other through a via contact penetrating the body layer, and a solder resist may be coated on the entire lower and upper surfaces of the body layer, except for terminal connection portions, for example, the upper conductive pad 219 and the lower conductive pad 211, to implement a lower protective layer and an upper protective layer.

The PCB 200 may be a single-layer PCB having interconnection lines on only one side thereof or a double-layer PCB having interconnection lines on both sides thereof. Further, the PCB 200 may be implemented as a multilayer interconnection PCB by forming interconnection patterns having three or more layers by using an insulator called a prepreg.

A process of manufacturing the semiconductor package 30 using the printed circuit board 200 is the same as or similar to the process of manufacturing the semiconductor package 10, described above with reference to FIGS. 1 to 10, except for a position where the external connection terminal 610 is formed, and thus, detailed description thereof will be omitted.

Figure 13:
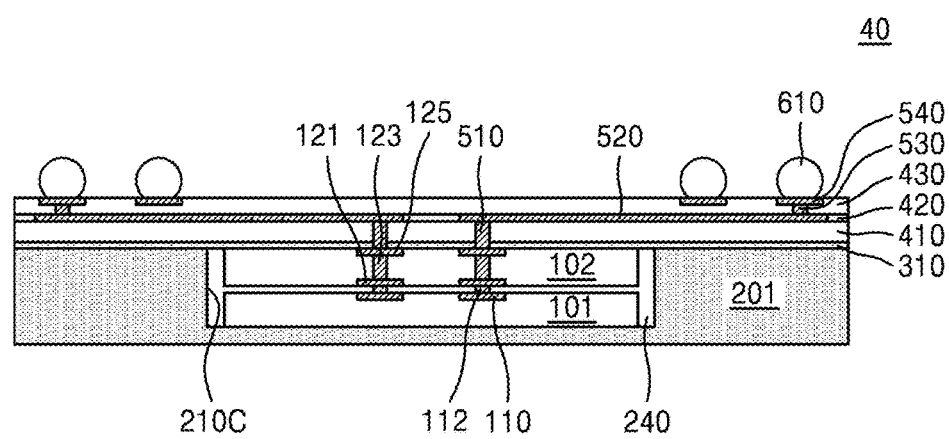

Referring to FIG. 13, a semiconductor package 40, in which a plurality of semiconductor chips 101 and 102, i.e., first and second semiconductor chips 101 and 102, are mounted in a substrate 201 including a cavity region 210C, is illustrated.

The first semiconductor chip 101 and the second semiconductor chip 102 are stacked, and the first semiconductor chip 101 is positioned under the second semiconductor chip 102. However, the present disclosure is not limited thereto.

The plurality of semiconductor chips 101 and 102 in the semiconductor package 40 are mounted so as to be completely accommodated in the cavity region 210C of the substrate 201, and an adhesive member (not shown) is formed on the bottom surface of the first semiconductor chip 101 to fix the first semiconductor chip 101 to the substrate 201.

In order to facilitate the mounting of the plurality of semiconductor chips 101 and 102, the plurality of semiconductor chips 101 and 102 have sizes slightly smaller than the size of the cavity region 210C. The top surface of the substrate 201 and the top surface of the second semiconductor chip 102 may be aligned on the same plane, and a space between the side surfaces of the plurality of semiconductor chips 101 and 102 and the side surface of the cavity region 210C is filled with an encapsulant 240. Although in the embodiment of FIG. 13, both semiconductor chips 101 and 102 are illustrated as having the same sizes, the disclosure is not limited thereto. In some embodiments, the size of the semiconductor 101 may be different than the size of the semiconductor chip 102.

The semiconductor package 40 may include the first semiconductor chip 101 and the second semiconductor chip 102 stacked in a vertical direction. The plurality of semiconductor chips 101 and 102 may be electrically connected to each other through connection bumps 112. In addition, the plurality of semiconductor chips 101 and 102 may be attached to each other by a non-conductive film.

The plurality of semiconductor chips 101 and 102 may be a logic chip or a memory chip. For example, the plurality of semiconductor chips 101 and 102 may all be memory chips of the same kind, or some of the plurality of semiconductor chips 101 and 102 may be memory chips and others may be a logic chip.

Although the semiconductor package 40 in which the plurality of semiconductor chips 101 and 102 are stacked is exemplarily shown in FIG. 13, the number of semiconductor chips that are stacked in the semiconductor package 40 is not limited thereto. For example, three or more semiconductor chips may be stacked in the semiconductor package 40.

The first semiconductor chip 101 may have a top surface and a bottom surface. A connection pad 110 may be formed on the top surface of the first semiconductor chip 101. An adhesive member may be formed on the bottom surface of the first semiconductor chip 101.

The second semiconductor chip 102 may have a top surface and a bottom surface. The second semiconductor chip 102 may include a lower connection pad 121 formed on the bottom surface of the second semiconductor chip 102 and an upper connection pad 125 formed on the top surface of the second semiconductor chip 102. A through silicon via (TSV) 123 may penetrate the second semiconductor chip 102 and extend from the top surface of the second semiconductor chip 102 to the bottom surface thereof, and may be connected to the lower connection pad 121 and the upper connection pad 125.

The second semiconductor chip 102 may be mounted on the top surface of the first semiconductor chip 101. The second semiconductor chip 102 may be electrically connected to the first semiconductor chip 101 through the connection bumps 112 interposed between the first semiconductor chip 101 and the second semiconductor chip 102.

A process of manufacturing the semiconductor package 40 is the same as or similar to the process of manufacturing the semiconductor package 10, described above with reference to FIGS. 1 to 10, except for the plurality of semiconductor chips 101 and 102, and thus, detailed description thereof will be omitted.

Figure 14:
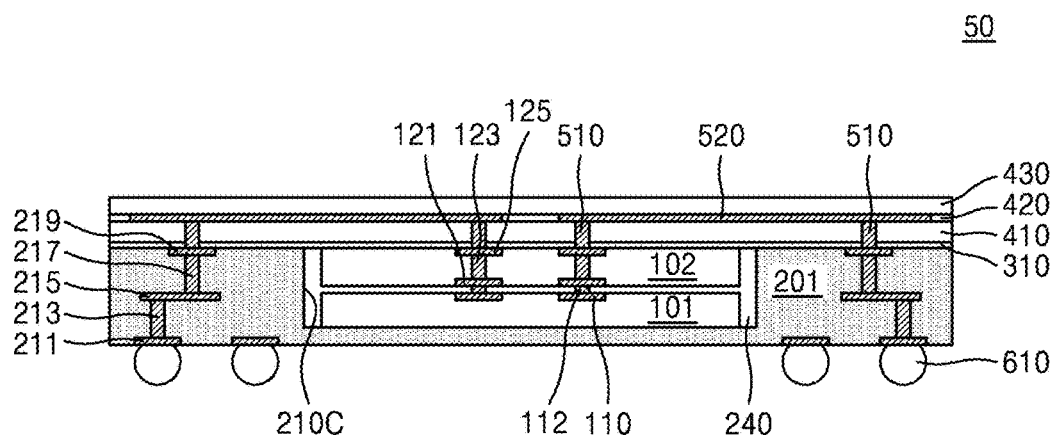

Referring to FIG. 14, a semiconductor package 50, in which an external connection terminal 610 is formed on the bottom surface of a substrate 201 and a plurality of semiconductor chips 101 and 102 are mounted in a cavity region 210C, is illustrated.

In the semiconductor package 50, the plurality of semiconductor chips 101 and 102 are mounted in a substrate 201 having the cavity region 210C and a connection region 210 around the cavity region 210C, in which a ball-land is formed, and a redistribution line 520 may be formed to form the external connection terminal 610 on a surface opposite to a surface on which the redistribution line 520 is formed.

In some embodiments, a method of manufacturing a semiconductor package may include: providing a substrate including a recess space for accommodating a semiconductor chip and a connection region surrounding the recess region; providing a semiconductor chip in the recess region, the semiconductor chip including a connection pad formed on a top surface of the semiconductor chip; forming a protective layer covering a top surface of the substrate and the top surface of the semiconductor chip including the connection pad; coating a photosensitive insulating film on the protective layer after forming the protective layer; irradiating light to the photosensitive insulating layer to form a trench so that the protective layer on the connection pad is exposed; removing the exposed protective layer; and forming a redistribution line to be electrically connected to the connection pad. The process of irradiating light or laser to the photosensitive insulating layer may include: etching an upper portion of the photosensitive insulating layer to a pre-determined depth and dissolving a non-etched lower portion of the photosensitive insulating layer at the same time by using same light or laser.

A process of manufacturing the semiconductor package 50 is the same as or similar to the process of manufacturing the semiconductor package 10, described above with reference to FIGS. 1 to 10, except for the mounting position of the external connection terminal 610 and the plurality of semiconductor chips 101 and 102, and thus, detailed description thereof will be omitted.

Figure 15:
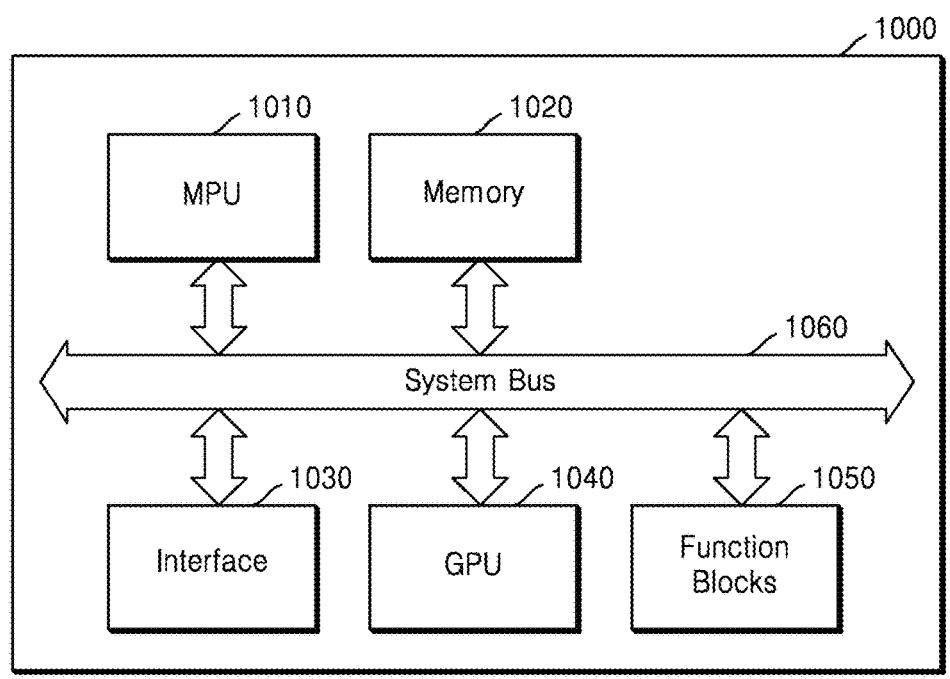
FIG. 15 is a schematic diagram of a configuration of a semiconductor package manufactured by a method of manufacturing a semiconductor package, according to an exemplary embodiment of the present disclosure.

FIG. 15 is a schematic diagram of a configuration of a semiconductor package 1000 manufactured by a method of manufacturing a semiconductor package, according to an exemplary embodiment of the present disclosure.

Referring to FIG. 15, the semiconductor package 1000 may include a micro processing unit (MPU) 1010, a memory 1020, an interface 1030, a graphics processing unit (GPU) 1040, functional blocks 1050, and a bus 1060 connecting these elements.

The semiconductor package 1000 may include both the MPU 1010 and the GPU 1040 or may include only one of the MPU 1010 and the GPU 1040.

The MPU 1010 may include a core and an L2 cache. For example, the MPU 1010 may include multi-cores. The multi-cores may have the same performance as each other or different performances from each other. Also, the multi-cores may be simultaneously activated or may have different activation time points.

The memory 1020 may store a result processed in the functional blocks 1050 by control of the MPU 1010. The interface 1030 may exchange information or signals with external apparatuses. The GPU 1040 may perform graphic functions. For example, the GPU 1040 may perform video codec or may process three-dimensional (3D) graphics. The functional blocks 1050 may perform various functions. For example, when the semiconductor package 1000 is an application processor (AP) used in a mobile apparatus, some of the functional blocks 1050 may perform a communication function.

The semiconductor package 1000 may include the semiconductor package 10, 20, 30, 40, or 50 manufactured by a semiconductor package manufacturing method according to embodiments of the present disclosure, described with reference to FIGS. 10 to 14.

While the present disclosure has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
   providing a substrate including a mounting region having a recess space for accommodating a semiconductor chip and a connection region surrounding the mounting region;
   providing a semiconductor chip in the mounting region, the semiconductor chip including a connection pad formed on a top surface of the semiconductor chip;
   forming a protective layer covering a top surface of the substrate and the top surface of the semiconductor chip;
   forming a photosensitive insulating layer on the protective layer after forming the protective layer;
   patterning the photosensitive insulating layer thereby exposing the protective layer;
   removing the exposed protective layer; and
   forming a redistribution line configured to be electrically connected to the connection pad,
   wherein the protective layer comprises an insulating material, and a thickness of the protective layer is less than a thickness of the photosensitive insulating layer, and
   wherein the protective layer comprises a silicon oxide layer, a silicon nitride layer, or a silicon oxynitride layer.

2. The method of claim 1, wherein forming the photosensitive insulating layer comprises attaching, in a roll shape, a photosensitive insulating layer in a form of a film, in which a bottom surface has an adhesive property, onto the protective layer.

3. The method of claim 1, wherein removing the exposed protective layer comprises removing a residue of the photosensitive insulating layer while removing the exposed protective layer.

4. The method of claim 1, wherein removing the exposed protective layer comprises:
   descumming a residue of the photosensitive insulating layer; and
   etching the exposed protective layer.

5. The method of claim 1, wherein providing the semiconductor chip comprises aligning the top surface of the semiconductor chip with the top surface of the substrate so that the top surface of the substrate and the top surface of the semiconductor chip are co-planar.

6. The method of claim 1, wherein the recess space of the mounting region comprises an opening in which the semiconductor chip is accommodated.

7. The method of claim 6, wherein providing the semiconductor chip includes placing the semiconductor chip in the mounting region, and further comprising, after placing the semiconductor chip in the mounting region, filling an encapsulant in a space between the mounting region and the semiconductor chip.

8. The method of claim 1, further comprising:
   after forming the redistribution line,
   exposing a portion of the redistribution line to the outside of the semiconductor package and forming a redistribution pad; and
   forming an external connection terminal, electrically connected to the redistribution pad, above the connection region.

9. The method of claim 1, wherein the removing the exposed protective layer comprises:
   irradiating light to the photosensitive insulating layer to form a trench so that the protective layer on the connection pad is exposed; and
   dry etching or wet etching the exposed protective layer to remove the exposed protective layer.

10. A method of manufacturing a semiconductor package, the method comprising:
    providing a substrate having a cavity region for accommodating a semiconductor chip and a ball-land region around the cavity region;
    providing a first semiconductor chip in the cavity region;
    stacking a second semiconductor chip on the first semiconductor chip in the cavity region, the second semiconductor chip including a connection pad provided on a top surface of the second semiconductor chip;
    forming a protective layer covering a top surface of the substrate and the top surface of the second semiconductor chip;
    forming a photosensitive insulating layer on the protective layer after forming the protective layer;
    patterning the photosensitive insulating layer to expose the protective layer;
    forming a via hole by removing a residue of the photosensitive insulating layer while removing the exposed protective layer;
    filling the via hole to form a redistribution line, wherein the redistribution line is configured to electrically connect the connection pad to the ball-land region; and
    forming an external connection terminal electrically connected to the ball-land region,
    wherein the substrate comprises a printed circuit board including a single-layer or multilayer interconnection pattern therein.

11. The method of claim 10, wherein the second semiconductor chip comprises a through silicon via (TSV).

12. The method of claim 10, wherein the ball-land region comprises a top ball-land formed on a top surface of the printed circuit board and a bottom ball-land formed on a bottom surface of the printed circuit board,
    wherein the top ball-land and the bottom ball-land are electrically connected to each other through the single-layer or multilayer interconnection pattern and the external connection terminal is formed on the bottom ball-land.

13. The method of claim 12, wherein forming the via hole comprises exposing the connection pad and the top ball-land.

14. The method of claim 10, wherein the removing the exposed protective layer comprises:
   irradiating light to the photosensitive insulating layer to form a trench so that the protective layer on the connection pad is exposed; and
   dry etching or wet etching the exposed protective layer to remove the exposed protective layer.

15. A method of manufacturing a semiconductor package, the method comprising:
   providing a substrate including a recess region for accommodating a semiconductor chip and a connection region surrounding the recess region;
   providing a semiconductor chip in the recess region, the semiconductor chip including a connection pad formed on a top surface of the semiconductor chip;
   forming a protective layer covering a top surface of the substrate and the top surface of the semiconductor chip including the connection pad;
   coating a photosensitive insulating film on the protective layer after forming the protective layer;
   irradiating light to the photosensitive insulating film to form a trench so that the protective layer on the connection pad is exposed;
   removing the exposed protective layer; and
   forming a redistribution line configured to be electrically connected to the connection pad,
   wherein the protective layer comprises a silicon oxide layer, a silicon nitride layer, or a silicon oxynitride layer.

16. The method of claim 15, wherein irradiating light to the photosensitive insulating film comprises:
   etching an upper portion of the photosensitive insulating film to a pre-determined depth; and
   dissolving a non-etched lower portion of the photosensitive insulating film.

17. The method of claim 16, wherein both etching an upper portion and dissolving a non-etched lower portion are performed at the same time.

18. The method of claim 15, wherein removing the exposed protective layer comprises removing a residue of the photosensitive insulating film while removing the exposed protective layer.

19. The method of claim 15, wherein the removing the exposed protective layer comprises dry etching or wet etching the exposed protective layer.

* * * * *